United States Patent [19]
Matsui et al.

[11] Patent Number: 4,811,351
[45] Date of Patent: Mar. 7, 1989

[54] SEMICONDUCTOR LASER ARRAY DEVICE

[75] Inventors: Sadayoshi Matsui, Tenri; Mototaka Taneya, Nara; Mitsuhiro Matsumoto, Tenri; Hidenori Kawanishi, Osaka, all of Japan

[73] Assignee: Sharp Kabushiki Kaisha, Osaka, Japan

[21] Appl. No.: 35,477

[22] Filed: Apr. 7, 1987

[30] Foreign Application Priority Data

Apr. 7, 1986 [JP] Japan .................. 61-80478

[51] Int. Cl.[4] .............................................. H01S 3/19
[52] U.S. Cl. ........................................ 372/50; 372/45; 372/49
[58] Field of Search ...................... 372/44, 45, 46, 50, 372/49

[56] References Cited

U.S. PATENT DOCUMENTS

| | | | |
|---|---|---|---|
| 4,719,634 | 1/1988 | Streifer et al. | 372/46 |
| 4,722,089 | 1/1988 | Botez et al. | 372/50 |
| 4,742,526 | 5/1988 | Matsui et al. | 372/44 |
| 4,751,709 | 6/1988 | Matsumoto et al. | 372/50 |
| 4,752,932 | 6/1988 | Matsumoto et al. | 372/45 |
| 4,760,580 | 7/1988 | Thompson et al. | 372/50 |

OTHER PUBLICATIONS

US-Z: Appl. Phys. Lett., vol. 47, Nr. 4, 1985, Seiten 341-343, Taneya, H. u.a.
US-Z: RCA Review, vol. 44, 1983, Seiten 625 bis 833, Ackley, D. E. u.a.
Patents Abstr. of Japan, Sect. E., vol. 10 (1986), Nr. 65 (E-388), JP 60-214 579 A 2.

Primary Examiner—James W. Davie
Attorney, Agent, or Firm—Ciotti & Murashige, Irell & Manella

[57] ABSTRACT

A semiconductor laser array device comprising a substrate; an index-waveguiding area positioned on said substrate; a Fourier-converting area, which is adjacent to said waveguiding area and in which laser lights emitted with synchronized phases from said waveguiding area undergo the Fourier-conversion, positioned on said substrate; and a reflecting mirror, which is adjacent to said Fourier-converting area and by which said converted laser lights with a 0°-phase shift mode are selectively reflected so as to be incident upon said waveguiding areas.

11 Claims, 3 Drawing Sheets

FIG. 3
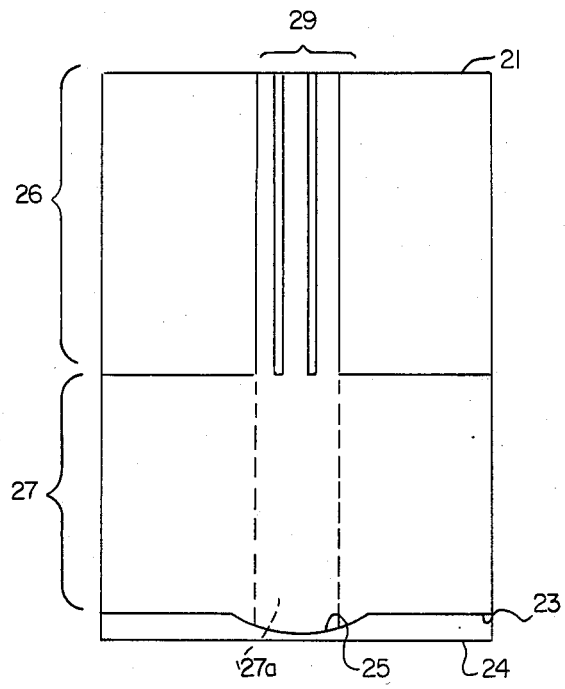
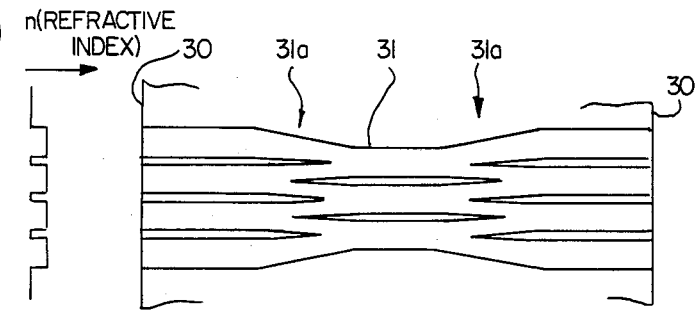
FIG. 4(a) PRIOR ART
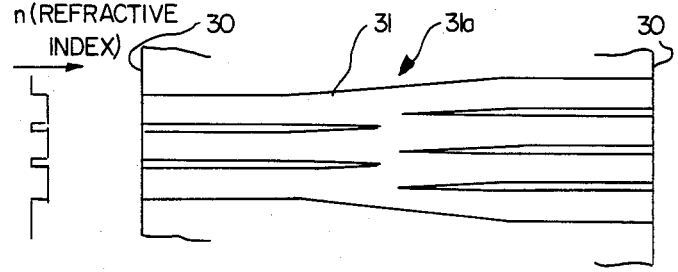
FIG. 4(b) PRIOR ART

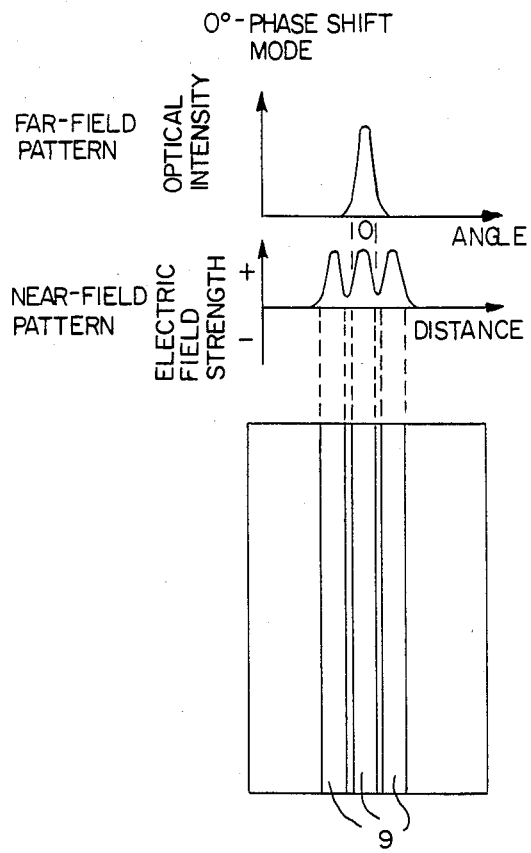
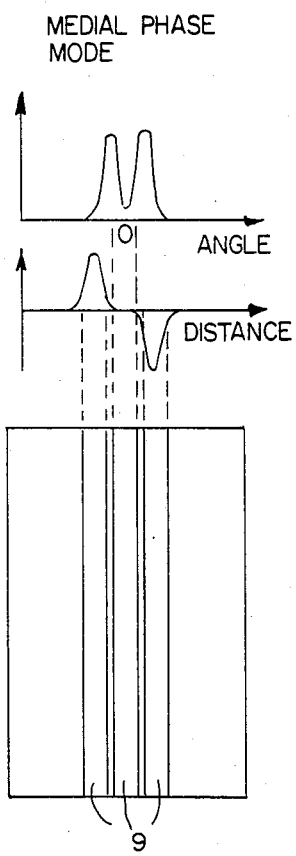
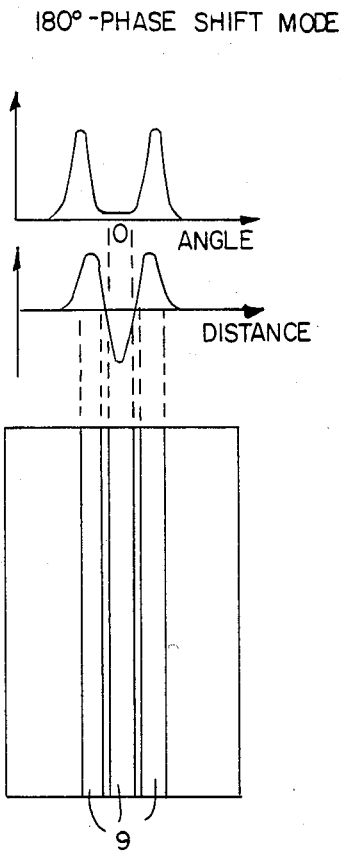
FIG. 5(a) 0°-PHASE SHIFT MODE
FIG. 5(b) MEDIAL PHASE MODE
FIG. 5(c) 180°-PHASE SHIFT MODE
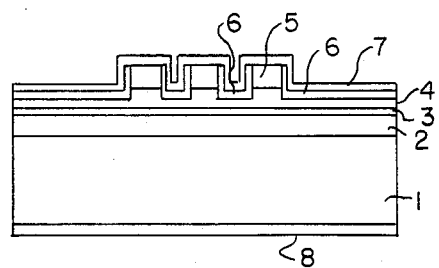
FIG. 6

SEMICONDUCTOR LASER ARRAY DEVICE

BACKGROUND OF THE INVENTION

1. Field of the invention:

This invention relates to a semiconductor laser array device which oscillates high output power laser lights with a 0°-phase shift therebetween.

2. Description of the prior art:

Semiconductor laser devices having a single lasing filament structure can only produce 50 mW lights at their best. In order to produce high output power, semiconductor laser devices, in which a plurality of lasing filaments are disposed in a parallel manner on a single substrate to achieve an optical coupling between the adjacent lasing filaments, have been studied.

In the case where a plurality of index-guided semiconductor laser devices are disposed in a parallel manner with an optical phase coupling between the adjacent lasing filaments and the individual laser devices have the same gain, they tend to oscillate laser lights with a 180°-phase shift therebetween rather than with a 0°-phase shift therebetween. This is because the electric field distribution is in accord with the gain distribution in the 180°-phase shift mode rather than in the 0°-phase shift mode, resulting in a small oscillation threshold gain in the 180°-phase shift mode. In order to prevent this phenomenon, the oscillation threshold gain in the 180°-phase shift mode must be increased to suppress the 180°-phase shift mode. For this purpose, as shown in FIGS. 4(a) and 4(b), semiconductor laser arrays having a structure with branching and combining type waveguides 31 on both facets 30 have been proposed. Each waveguide 31 of the semiconductor laser array shown in FIG. 4(a) is provided with two branching portions 31a, and that of the semiconductor laser array shown in FIG. 4(b) is provided with one branching portion 31a. The basic operation of these laser array devices is as follows: Lights, which are propagated with a 0°-phase shift therebetween in the branching waveguides, proceed to the combining waveguides with the same phase, so that the lights are intensified. On the contrary, when lights, which are propagated with a 180°-phase shift therebetween in the branching waveguides, proceed to the combining waveguides, they exhibit a reciprocal phase with each other, so that the lights are considerably weakened, resulting in a radiant mode in which the lights radiate outside of the waveguide. In such a manner, the lights with a 180°-phase shift therebetween undergo loss, resulting in an increase in the oscillation threshold gain in the 180°-phase shift mode.

However, oscillation threshold gain in the medial mode between the 0°-phase shift mode and the 180°-phase shift mode is reduced with an increase in the number of waveguides, so that oscillation in the 0°-phase shift mode cannot be achieved. For example, FIGS. 5(a) to 5(c) show the distributions of electric field E and the far-field pattern with regard to the 0°-phase shift mode (a), the 180°-phase shift mode (c), and the medial modes (b) therebetween, respectively, in a laser array having a structure with a plurality of parallel active waveguides shown in FIGS. 5(a) to 5(c). It can be seen from FIGS. 5(a) to 5(c) that the far-field pattern with regard to a 0°-phase shift mode (a) exhibits an emission direction of laser lights which is vertical to the emitting face of the array device, whereas the far-field patterns with regard to the other modes (b) and (c) exhibit the emission direction of laser lights with an inclination to the emitting face of the array device. That is, the electric field distribution of laser lights in the 0°-phase shift mode exhibits peaks in the center, while the electric field distributions of laser lights in the other modes (b) and (c) exhibit peaks on both sides.

The far-field pattern of laser lights with a 0°-phase shift therebetween produced by conventional semiconductor laser array devices exhibits a single peak so that the laser lights can be concentrated into a spot by means of optical lenses, whereas the far-field pattern of laser lights with a 180°-phase shift therebetween or each of the medial modes between the 0°-phase shift mode and the 180°-phase shift mode exhibits dual peaks so that the laser lights cannot be concentrated into a spot by any optical lens. These semiconductor laser array devices producing laser lights which cannot be concentrated into a spot are inconvenient in optical coupling with other optical systems, and cannot be used as light sources for optical communication, optical disc systems, etc.

Thus, creation of a semiconductor laser array device oscillating laser lights with a 0°-phase shift therebetween (i.e., attaining higher oscillation gain in the 0°-phase shift mode than in the 180°-phase shift mode and in the medial modes), which can thereby be utilized as a light source for optical communication, is required.

SUMMARY OF THE INVENTION

The semiconductor laser array device of this invention, which overcomes the above-discussed and numerous other disadvantages and deficiencies of the prior art, comprises a substrate; an index-waveguiding area positioned on said substrate; a Fourier-converting area, which is adjacent to said waveguiding area and in which laser lights emitted with synchronized phases from said waveguiding area undergo the Fourier-conversion, positioned on said substrate; and a reflecting mirror, which is adjacent to said Fourier-converting area and by which said converted laser lights with a 0°-phase shift mode are selectively reflected so as to be incident upon said waveguiding area.

In a preferred embodiment, the waveguiding area is composed of a plurality of branching and combining type index-guided active waveguides in a parallel manner.

In a preferred embodiment, the reflecting mirror is formed on the facet at the Fourier-converting area side and constructed of a single- or multi-layered film made of $Al_2O_3$ and/or amorphous Si.

In a preferred embodiment, the center area of said reflecting mirror corresponding to the active waveguides is formed into either a flat or concave shape.

Thus, the invention described herein makes possible the objects of (1) providing a semiconductor laser array device having a plurality of index-guided semiconductor lasers in a parallel manner with an optical phase coupling between the adjacent lasing filaments on the same substrate, which attains a 0°phase shift between the adjacent lasing filaments, resulting in high output power laser lights with the radiation pattern of a single peak; and (2) providing a semiconductor laser array device in which laser lights emitted from a plurality of active waveguides undergo the Fourier conversion in a Fourier-converting waveguiding-region and the converted laser lights in a 0°-phase shift therebetween are selectively reflected by a mirror so as to be introduced into the plurality of said active waveguides, so that oscillation threshold gain in the 0°-phase shift mode can be made smaller than that of other array modes, whereby laser lights with a 0°-phase shift therebetween can be stably oscillated and concentrated into a single spot, allowing for the production of excellent resolution optical machinery utilizing laser lights.

BRIEF DESCRIPTION OF THE DRAWINGS

This invention may be better understood and its numerous objects and advantages will become apparent to those skilled in the art by reference to the accompanying drawings as follows:

FIG. 3 is a plane view showing another semiconductor laser array device of this invention.

FIGS. 4(a) and 4(b), respectively, are diagrams showing conventional semiconductor laser array devices and its refractive indexes at the facets.

FIGS. 5(a) to 5(c), respectively, are graphs showing the far-field patterns and the near-field patterns of a 0°-phase shift mode, a medial mode and a 180°-phase shift mode in a conventional laser array device.

FIG. 6 is a sectional view taken along line 6—6 of FIG. 2.

DESCRIPTION OF THE PREFERRED EMBODIMENTS

This invention provides a semiconductor laser array device having a plurality of index-guided waveguides in a parallel manner with an optical phase coupling between the adjacent lasing filaments, in which synchronous laser lights emitted from the plural active waveguides undergo the Fourier conversion in the Fourier-converting waveguiding-region and the converted laser lights in a 0°-phase shift mode are selectively reflected by the mirror portion that is adjacent to the said converting waveguiding-region, resulting in synchronous oscillation of laser lights with a 0°-phase shift therebetween.

EXAMPLE 1

Figure 1:
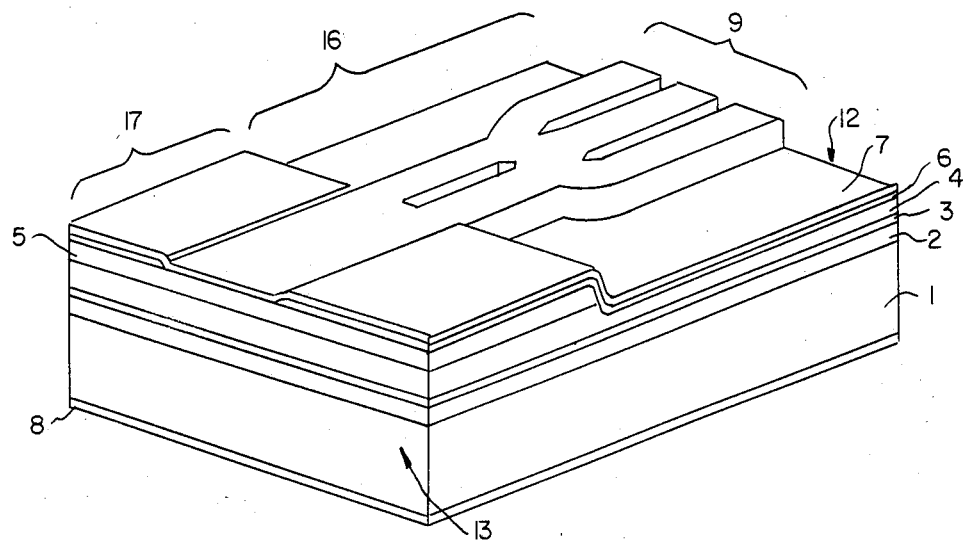
FIG. 1 is a perspective view showing a semiconductor laser array device of this invention.

FIGS. 1 and 6 show a GaAs-GaAlAs semiconductor laser array device having a flat active layer of this invention, which is produced as follows: On an n-GaAs substrate 1, an n-$Al_xGa_{1-x}As$ cladding layer 2, a p- or n- $Al_yGa_{1-y}As$ active layer 3, a p-$Al_xGa_{1-x}As$ cladding layer 4, and a p-GaAs cap layer 5 are successively grown by an epitaxial growth technique (wherein x>y), resulting in a double-heterostructure multi-layered growth crystal for laser oscillation. Then, the portions of the p-cap layer 5 and the p-cladding layer 4, which correspond to the waveguides, are removed by photolithography and a chemical etching or dry etching technique, which are known by those skilled in the art, so as to form a plurality of index-guided active waveguides 9. The refraction index of the active waveguides is set depending upon the thicknesses of both the p-cladding layer 4, which has undergone the etching treatment, and the active layer 3. It is usually set to be in the range of $5 \times 10^{-3}$ to $3 \times 10^{-2}$ in laser arrays producing laser lights with synchronized phases.

Then, a $Si_3N_4$ film 6 is formed over the entire area of the p-cap layer 5 and the above-mentioned etched portion by plasma assisted chemical vapor deposition, and the portion of the $Si_3N_4$ film 6 corresponding to the waveguides 9 is removed by photolithography, followed by the formation of a p-ohmic contact 7 on the $Si_3N_4$ film 6 and the said removed portion thereof. An n-ohmic contact 8 is formed on the back face of the n-substrate. Thereafter, the wafer is cleaved at right angles to the waveguides 9 to form a laser array device unit having a cavity length of 200–400 μm.

By the above-mentioned process, the index-waveguiding area 16, which is composed of a plurality of branching and combining type index-guided active waveguides 9 in a parallel manner, and the Fourier-converting area 17, which is adjacent to the said index-waveguiding area 16, are formed. In the Fourier-converting area 17, laser lights emitted with synchronous phases from the active waveguides 19 undergo the Fourier conversion.

Figure 2:
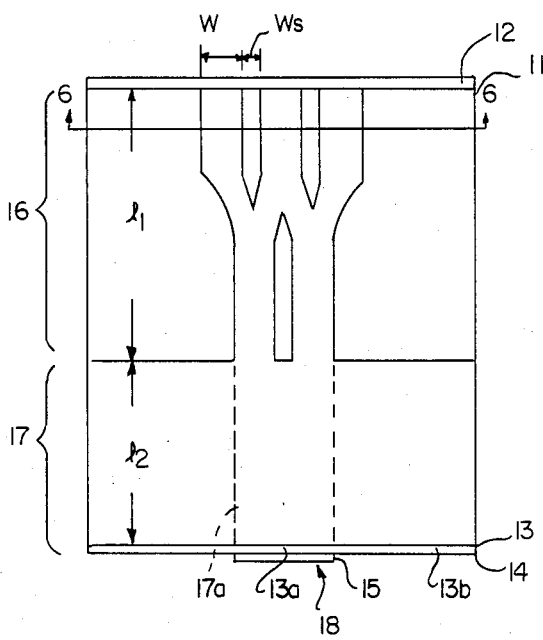
FIG. 2 is a plane view showing a process for the production of reflecting films on the facets of the laser array device shown in FIG. 1.

Then, both facets are covered with a single- or multi-layered film made of $Al_2O_3$ and/or amorphous Si by electron-beam vapor deposition, resulting in laser reflectors on both facets. The thickness of each of the layers of the reflecting film composed of an $Al_2O_3$ single-layered film or an $Al_2O_3$-amorphous Si multi-layered film is set at a given value, so that the reflective index of the reflecting film will be at a value ranging from approximately 2% to 95%. According to this example, the reflective index of one reflecting film composed of an $Al_2O_3$ single-layered film having a thickness of λ/4 (λ being the oscillation wavelength) is approximately 2% and the reflective index of the other reflecting film composed of an $Al_2O_3$ double-layered film having a thickness of 2λ/4 (λ being the oscillation wavelength) is approximately 32%. These reflecting films are produced as follows: As shown in FIG. 2, an $Al_2O_3$ film having a thickness of λ/2 is formed on the facet 11 on the waveguide side by electron-beam vapor deposition, resulting in the reflector 12, and then on the other facet 13, an $Al_2O_3$ film 14 having a thickness of λ/4 is formed. Thereafter, a resist film is formed on the portion of the $Al_2O_3$ film 14 on the facet 13 corresponding to the outer region of the waveguiding area 16, and then an $Al_2O_3$ film 15 having a thickness of λ/4 is further formed on the $Al_2O_3$ film 14. Then, the resist film is removed by a remover, as shown in FIG. 2, resulting in a double-layered $Al_2O_3$ film with a thickness of 2λ/4 (the reflective index being about 32%) on the center area 13a of the facet 13 corresponding to the active waveguides 9, and a single-layered $Al_2O_3$ film with a thickness of λ/4 (the reflective index being about 2%) in the outer area 13b of the facet 13. The said double- and single- layered $Al_2O_3$ films form a resonator reflector 18 on the facet 13.

In this example, the $Al_2O_3$ films having a thickness of λ/4 (the reflective index being about 2%) and having a thickness of λ/2 (the reflective index being about 32%) were used, but an $Al_2O_3$-amorphous Si multi-layered film can be, of course, used therefor. It should be understood that when the reflective index in the center portion of the reflector on the facet 13 is set to be significantly high, approximately 95%, the resulting laser array device attains more excellent characteristics.

As mentioned above, by the formation of these different dielectric films on the facet 13, the reflective index of the center area of the facet 13 corresponding to the waveguiding area 16 containing a plurality of active waveguides becomes high, whereas that of the outer region of the facet 13 becomes low. Accordingly, loss of light in the 0°-phase shift mode due to the resonator reflector 18 is suppressed because laser lights are emitted in the vertical direction from a plurality of active waveguides as shown in FIG. 5(a), while loss of light in the other array modes due to the resonator reflector 18 is great because laser lights are emitted with an inclination from a plurality of active waveguides. As a result, loss of light in the 0°-phase shift mode becomes smaller than that of light in the other array modes, and the oscillation threshold gain in the 0°-phase shift mode also becomes small, so that, as shown in FIG. 5(a), the laser array device can stably oscillate synchronous laser lights with a 0°-phase shift therebetween.

With a conventional waveguided structure having a plurality of active waveguides that are not of a branching and combining type, but are of a parallel type, these active waveguides must be optically coupled therebetween with an evanescent wave arising between the adjacent active waveguides. On the other hand, with a waveguided structure of this invention having a plurality of branching and combining type active waveguides, a more stable 0°-phase shift mode can be attained when the active waveguides are optically coupled therebetween with the evanescent wave, and if these active waveguides are uniformly formed, optical coupling therebetween using such an evanescent wave will not necessarily be required.

The synchronous semiconductor laser array device shown in FIG. 2 was produced wherein the width W of each of the active waveguides 9 was 4 μm, the distance Ws between the adjacent active waveguides 9 was 1 μm, the length $l_1$ of the index-waveguiding area 16 was 250 μm, the length $l_2$ of the Fourier-converting area 17 was 50 μm, the reflective index of the facet 11 on the active waveguide side was 32%, the reflective index of the center area of the facet 13 on the Fourier-converting area side was 32%, and the reflective index of the outer area of the facet 13 was 2%. This laser array device oscillated in a 0°-phase shift mode up to an output power of 100 mW at an oscillation threshold current in the range of 130 to 160 mA, and laser oscillation in the other array modes was suppressed.

A plurality of active waveguides of the semiconductor laser array device of this invention is, of course, applicable not only to the above-mentioned index-guided structures, but also to other index-guided structures including buried types, loss-waveguide types, etc. This invention is also applicable not only to semiconductor laser array devices using GaAlAs-GaAs systems, but also to those using InP-InGaAsP systems, etc.

EXAMPLE 2

Another semiconductor laser array device is produced in the same manner as that of Example 1, except that a resonator reflector with a uniform reflective index over the entire area thereof is formed on the facet 13 at the Fourier-converting area side. This laser array device also brings about the phenomenon that laser lights in a 0°-phase shift mode are selectively introduced into a plurality of active waveguides due to the said resonator reflector. This is because, as seen from the far-field pattern of each mode shown in FIGS. 5(a) to 5(c), laser lights in the array modes other than the 0°-phase shift mode are emitted with an inclination from the active waveguides 9, so that the laser lights reflected by the resonator reflector cannot be incident upon the said active waveguides 9 at all.

EXAMPLE 3

FIG. 3 shows another semiconductor laser array device of this invention, which is produced in the same manner as that of Example 1, except that the center area of the facet 23 on the Fourier-converting area side that is opposite the facet 21 on the index-guided active waveguide side is formed into a convex mirror-like shape, and then a reflector mirror 24 is formed on the facet 23, resulting in a resonator reflector, the center area 25 of which functions as a convex mirror against laser lights, so that laser lights in a 0°-phase shift mode can be effectively and selectively introduced into the plural active waveguides 29 disposed in a parallel manner.

In the above-mentioned examples, the injection of current into the waveguides 17a (FIG. 2) and 27a (FIG. 3) in the Fourier-converting areas 17 (FIG. 2) and 27 (FIG. 3) is not required when loss of light in these areas is sufficiently suppressed. The Fourier-converting areas 17 and 27 can be, of course, constructed by materials different from those of the waveguiding areas 16 (FIG. 2) and 26 (FIG. 3).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising a substrate and an index-waveguiding area comprising a plurality of index-guided active waveguides and positioned on said substrate, a flat optical waveguide area positioned on said substrate adjacent to said waveguiding area and in which laser lights emitted with synchronised phases from said active waveguides propagate; wherein a reflecting mirror is formed in an adjacent relation to said flat optical waveguide, said mirror selectively reflecting said propagated laser lights with a 0°-phase shift mode, thereby returning the reflected laser lights to said active waveguides.

2. The device of claim 1, wherein said waveguiding area comprises a plurality of branching and combining type index-guided active waveguides in a parallel manner.

3. The device of claim 1, wherein said reflecting mirror is formed at said flat optical waveguide side.

4. The device of claim 2, wherein the center area of said reflecting mirror corresponding to the active waveguides is formed into a flat shape.

5. The device of claim 3, wherein said reflecting mirror is constructed of a single-layered film made of $Al_2O_3$.

6. The device of claim 3, wherein said reflecting mirror is constructed of a single-layered film made of amorphous Si.

7. The device of claim 3, wherein said reflecting mirror is constructed of a multi-layered film.

8. The device of claim 7, wherein said multi-layered film includes $Al_2O_3$.

9. The device of claim 7, wherein said multi-layered film includes amorphous Si.

10. The device of claim 7, wherein said multi-layered film includes $Al_2O_3$ and amorphous Si.

11. The device of claim 2, wherein the center area of said reflecting mirror corresponding to the active waveguides is formed into a concave shape.

* * * * *